United States Patent [19]
Arntz et al.

[11] Patent Number: 5,302,914
[45] Date of Patent: Apr. 12, 1994

[54] METHOD AND APPARATUS FOR REDUCING THE PEAK-TO-AVERAGE POWER IN MULTI-CARRIER RF COMMUNICATION SYSTEMS

[75] Inventors: Bernard J. Arntz, Morris Township, Morris County; William A. Nitz, Rockaway Township, Morris County; Josef Ocenasek, Parsippany-Troy Hills Township, Morris County, all of N.J.

[73] Assignee: AT&T Bell Laboratories, Murray Hill, N.J.

[21] Appl. No.: 964,596

[22] Filed: Oct. 20, 1992

[51] Int. Cl.⁵ ............................................. H03G 3/20
[52] U.S. Cl. .................................. 330/129; 330/124 R; 455/103; 455/126
[58] Field of Search ................ 330/124 R, 129, 279, 330/295; 455/103, 126

[56] References Cited

U.S. PATENT DOCUMENTS

| | | |
|---|---|---|
| 4,010,426 | 3/1977 | Rambo .................. 330/124 D X |
| 4,064,464 | 12/1977 | Morse ............................... 330/53 |
| 4,370,622 | 1/1983 | Hornbeck et al. .............. 330/207 P |
| 4,546,313 | 10/1985 | Moyer ........................... 324/107 P |
| 5,043,673 | 8/1991 | Suematsu et al. ............... 330/149 |
| 5,101,172 | 3/1992 | Ikeda et al. ..................... 330/136 |
| 5,101,211 | 3/1992 | DuFort ........................ 330/107 X |

FOREIGN PATENT DOCUMENTS 0466123  9/1991  European Pat. Off. .

Primary Examiner—James B. Mullins
Attorney, Agent, or Firm—Alfred G. Steinmetz

[57] ABSTRACT

Therefore a method and apparatus for controlling a linear amplifier processing a plurality of carrier signals of a multi channel carrier system alters the phases of one or more sources of the multi-channel signals in response to a detected peak envelope power or of a peak to average power ratio at regular scheduled intervals. This reduces the peak envelope power to average envelope power ratio and enables the reduction in the power rating required by the amplifiers handling the multi-channel signal.

6 Claims, 5 Drawing Sheets

METHOD AND APPARATUS FOR REDUCING THE PEAK-TO-AVERAGE POWER IN MULTI-CARRIER RF COMMUNICATION SYSTEMS

FIELD OF THE INVENTION

This invention relates to multi-channel signal amplification systems in a communication system and to a method and apparatus for increasing the average power handling capacity of such a multi-channel signal amplifier relative to its peak power rating. It is also concerned with preventing variations of the phases of individual carrier signals comprising the multiple channel signal from causing occurrences of very high envelope signal peaks in the multichannel signal.

BACKGROUND OF THE INVENTION

Wireless telecommunications systems are divided into a series of cell areas covering a service area. Each cell area has a transmitting base station using an operating frequency set comprising a plurality of radio channels to communicate with mobile subscribers. Each channel represents an information signal at a particular frequency carrier or band.

It has been found advantageous to combine these channels for transmission purposes. The channels are all combined by a broadband signal combiner into a multi-channel signal at low power levels and then amplified by a single linear amplifier (or its equivalent a plurality of linear amplifiers in parallel, each amplifying a reduced power version of the same multi-channel signal) to raise the multi-channel signal to an appropriate transmit power level.

The various radio channels are distributed in frequency with respect to each other in that each operates within a different frequency band. Each channel is FM modulated and hence has a signal of substantially constant amplitude. The peak occurrences of the combined signal is a highly complicated function of the individual carrier frequencies, modulation methods, signal contents and noise. Since the simultaneous occurrence of individual signal peaks can not easily be avoided, a multi-channel signal is subject to power maximums where the peak power significantly exceeds the average power of the envelope due to constructive addition of the individual signals.

It has been observed that, for narrowband FM, the modulation in some systems is not of adequate magnitude to significantly randomize the envelope. That is, the envelope can settle into a repetitive state of high peaks.

A straight forward response to this problem has been to select the power rating of the linear amplifier to accommodate the theoretical maximum peak power level of the composite multi-channel signal. Since signals add as voltage vectors the maximum peak power level of the composite multi-channel signal is N*N times the power of a single carrier signal where N is the number of signals combined to produce the the composite multi-channel signal. However, this significantly increases the cost of the linear amplifier since its power rating must be increased in proportion to the square of the number of signals processed. This high power rating is also only needed for a small fraction of the operating time of the amplifier (that is, during the high peaks of the combined multi-channel signal). It is most desirable to operate the system with amplifiers of power handling ratings based on the average power of the sum of the carriers than to require that an amplifier be rated to handle the high peak power caused by the constructive addition of the individual carriers.

SUMMARY OF THE INVENTION

Therefore a method and apparatus, embodying the principles of the invention, alters the phases of one or more sources of the multi-channel signals in order to reduce the peak envelope power of the composite multi-channel signal. This may be done in response to detected peak envelope power or with detection of related parameters without directly monitoring the peak envelop power of the signal. This result in phase adjustments to reduce the peak envelope power to average envelope power ratio while maintaining the same average power and enables the reduction in the peak power rating required by the amplifiers handling the multi-channel signal without altering the signal information of the individual signals.

In one embodiment of the invention, provision is made to detect the level of the peak envelope power and in response an adjustment is made to the phase of one or more of the signals prior to combining them into one composite signal. This adjustment is made in such a manner so as to reduce the peak envelope power of the composite signal fed into the amplifier. The peak envelope power is again evaluated and further phase adjustments may be made in order to further reduce the peak envelope power.

In a particular implementation of the embodiment, the phase of the reference frequency input to a phase locked RF source is changed when a high peak to average envelope power ratio is detected. The change is accomplished with a varactor diode phase shifter connected to the reference frequency input line. The phase locked loop maintains lock and also limits the rate of the phase change. The phase change of the reference frequency input of the phase-locked RF source produces a phase change at the RF output of the source which is determined by the ratio of the reference frequency to the RF output frequency. The amount of phase change at the output of the source is equal to M times the phase change at the reference frequency input, where M is equal to the RF output frequency divided by the reference frequency. In another similar implementation, the phase of the RF output is changed with an RF phase adjuster.

In yet another implementation, the polarity of one or more of the signals (which are combined to produce the composite signal) are inverted when a high peak power condition is detected.

In still another implementation, the phase of one or more of the signals (which are combined) are changed without directly monitoring the peak or average power levels.

These implementations may be embodied using either analog or digital control techniques.

DETAILED DESCRIPTION

Figure 1:
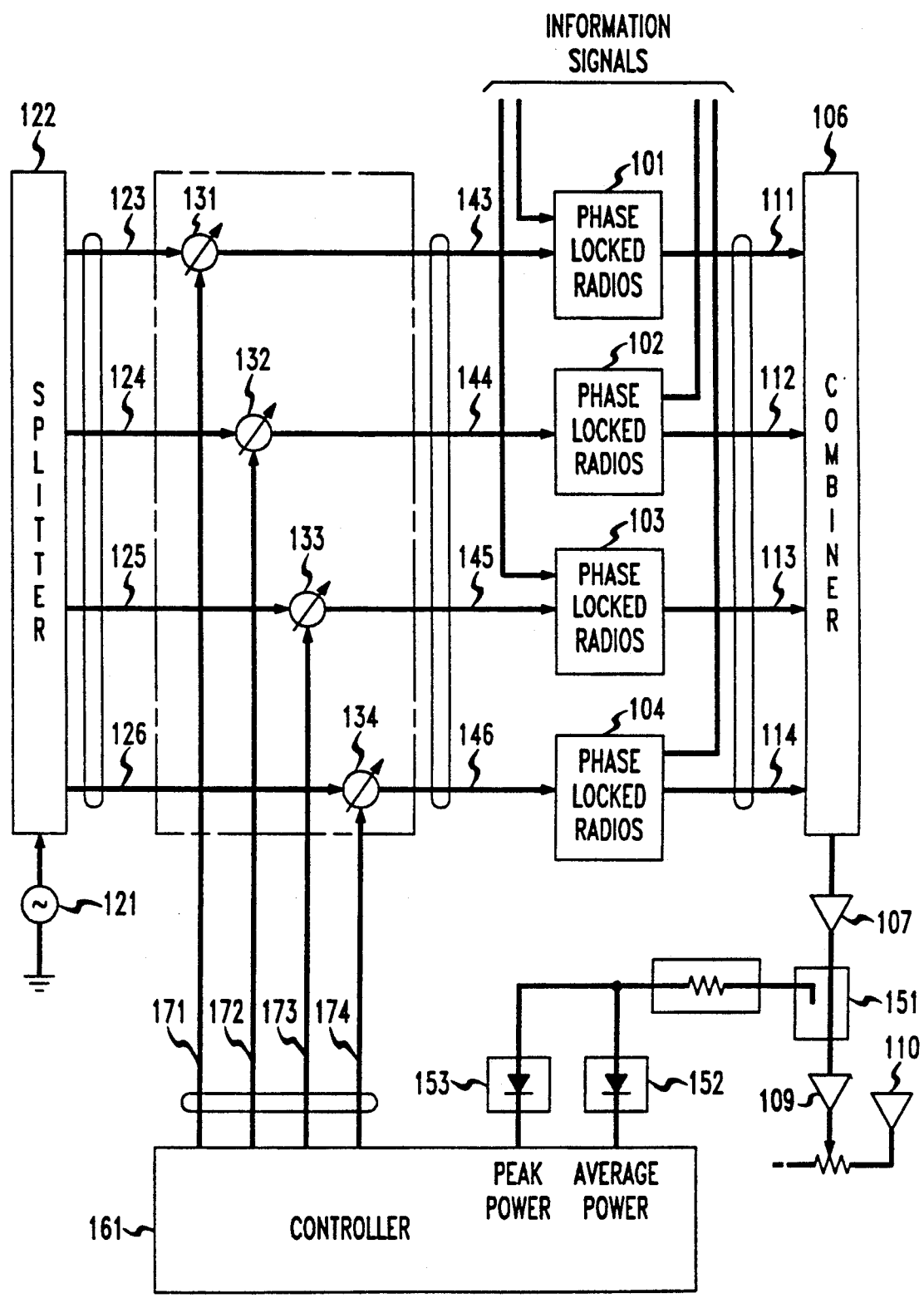
FIG. 1 is a block schematic of an amplifier system control arrangement to limit the peak to average power ratio.

An exemplary system for reducing the peak to average power ratio in an amplifier processing a plurality of different signal channels spaced apart in frequency from one another; each channel having a different carrier frequency is shown in the FIG. 1. The apparatus shown is included in a cellular base station in which the phase locked radios each handle a different channel in the channel set assigned to the cell served by the cellular base station.

A plurality of phase locked radio transceivers, 101, 102, 103 and 104, are connected to receive audio and data designated as information signals. These signals are FM modulated and transmitted at different carrier frequencies for each of the phase locked transceivers. The FM modulated signals (radio frequency output signals) are individually transmitted, via leads 111, 112, 113 and 114, to a combiner circuit 106 that combines all the modulated carrier signals into a composite modulated signal including all the information supplied to the radios 101-104. This composite signal is applied to the preamplifier 107 and subsequently to a linear amplifier 109 which amplifies the composite signal to a radio transmission level. The linear amplifier output is connected to an antenna 110 for transmission to the cell area.

The frequencies of the carrier signals in each of the radios are synchronized to a reference frequency supplied from a reference signal derived from a reference frequency generator 121. The output of the reference frequency generator 121 is applied to a signal splitter apparatus 122 which applies the reference frequency signal onto the four leads 123, 124, 125 and 126. These four leads are coupled to the voltage controlled phase shifters 131, 132, 133 and 134, whose operation is discussed subsequently. The output of the phase shifters is connected via leads 143, 144, 145 and 146 to reference signal inputs of the phase locked radios 101-104.

Figure 4:
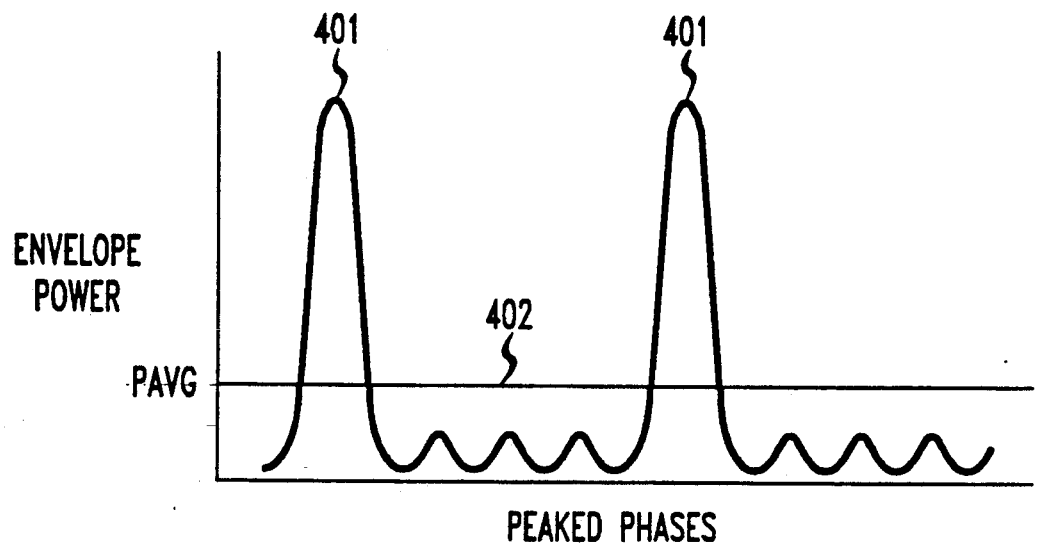
FIGS. 4 and 5 are graphs of waveforms of envelope power processed by the amplifier system.

In this illustrative arrangement the carriers of the transceivers are equally spaced apart in frequency. In this instance, the peak to average reduction is most advantageous. Each radio is locked to the same reference frequency supplied to the leads 123-146. Due to thermal effects in the phase locked loops, the carrier frequencies drift with respect to each other and, as shown in FIG. 4, the peaks of several carriers may coincide in time producing a high peak envelope power in the linear amplifier. In general, the envelope of the combined signals are periodic at the rate of 1/f where f is the frequency spacing between carriers. These envelope peaks may exist for extended periods of time, which is associated with the thermal draft of the phase locked transceivers.

The power input to the linear amplifier 109 is sensed by the coupling device 151 which is connected to an average power detector 152 and a peak power detector 153. The values for average power and peak power are applied to a controller 161. The Controller, which may be implemented in either digital or analog form, continuously monitors the peak power to average power ratio of the signal processed by the linear amplifier 109. Controller 161 includes circuitry to evaluate this ratio and uses the information to apply control voltages, via leads 171, 172, 173 and 174, to the voltage controlled phase shifters 131-134. In the illustrative embodiment this control circuit may comprise stored program control, logic arrays or analog circuitry.

In the arrangement of FIG. 1, a 1 to 3 degree phase shift of the reference frequency inputs corresponds to a 60 to 180 degree phase shift at the RF outputs since the ratio of the radio frequency to the reference frequency is equal to 60. The phase shift for each individual carrier is applied to the corresponding reference signal input to which the radio carrier is synchronized. In the illustrative embodiment this reference frequency is in the 15 MHz range.

Figure 3:
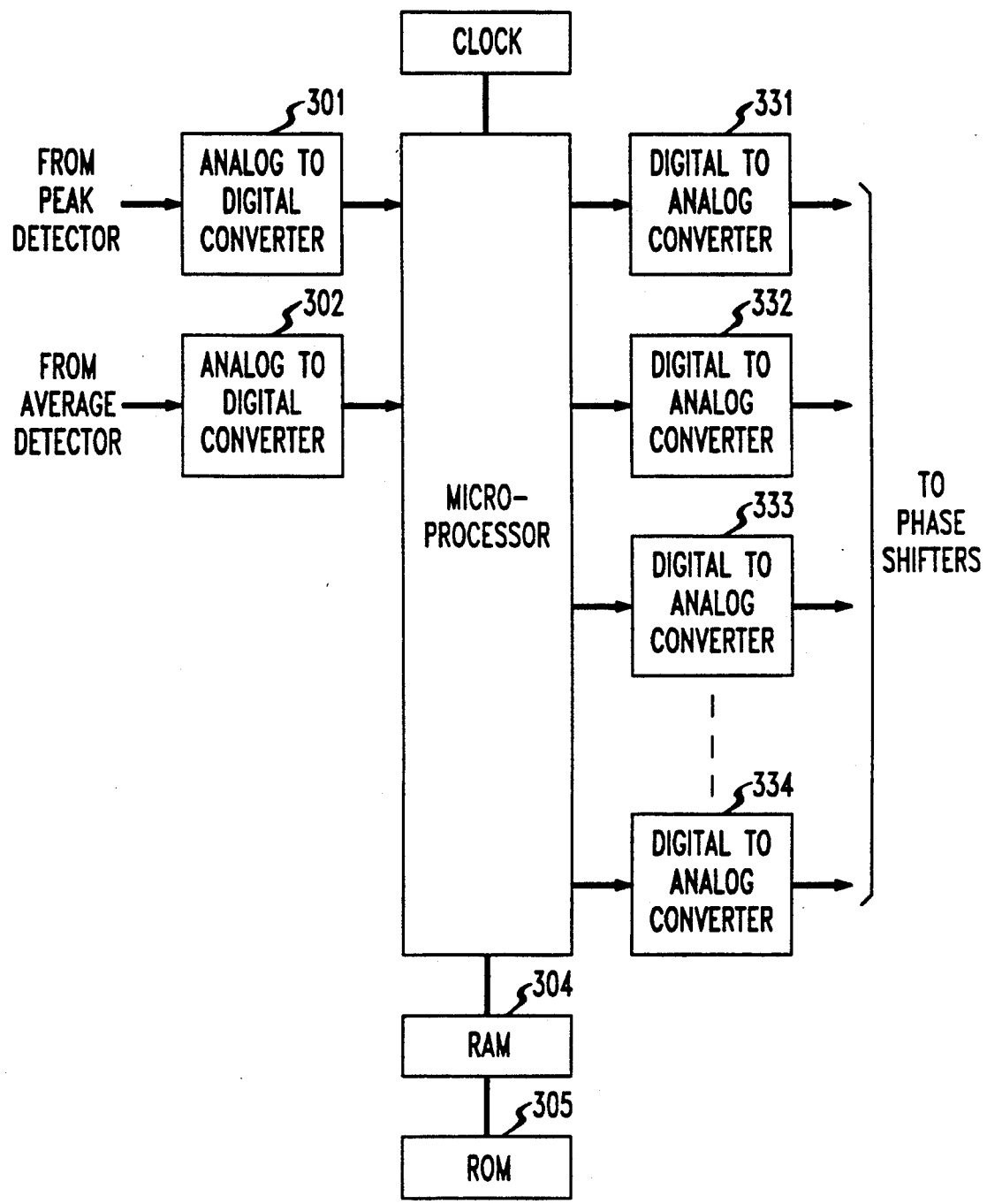
FIG. 3 is a block schematic of a stored program controller used in the amplifier control systems of FIGS. 1 and 2.

A typical stored program controller suitable for use as the controller is shown in the FIG. 3. The controller monitors the average and peak envelope powers of the input signal to the Linear amplifier. The average power herein is understood to be the thermal equivalent power, averaged over a time period longer than the fluctuations of the envelope power, perhaps 100 mS. The peak envelope power is that power detected by a classical video diode peak detector, which stores the peak value in a capacitor which decays at a rate somewhat slower than the frequency of occurrence of the peaks.

By measuring both the peak envelope and average powers, the controller of FIG. 3 can compute the peak to average ratio of the signal and optimize for a minimum ratio. The hardware implementation, as shown in the FIG. 3, includes two analog to digital converters, 301 and 302 which receive input from a peak detector (153 in FIG. 1) and an average power detector (152 in FIG. 1) respectively, and apply a digitized version of the peak and average power to a microprocessor. The microprocessor includes associated RAM (304) and ROM (305) memory capacity, which provide memory storage and stored instructions for controlling the processing of the sensed power signals and generating the output control signals to control the phase shifting circuitry (131-134 in FIG. 1). The microprocessor 303 feeds digital phase shift control signals to one or more of a set of digital to analog converters 331-334 which in turn supply analog control signals to control the phase shift circuits 131-134 shown in FIG. 1. While the illustrated controller uses a microprocessor and digital signals it is to be under stood that a completely analog controller can be used, with sample and holds and comparators and op amps.

Optimization of the peak to average power ratio is done with a successive trial and error procedure, since the correlation between phase of a given radio and the peak to average ratio of the combined radio signal is very complex, and because the absolute phase of a given radio is not easily controllable. The controller adjusts one or more of the phase shifters at a time, then monitors the peak to average ratio. If there is an improvement (decrease) in the peak level, the controller continues phase adjustment in the same direction. When a minimum peak to average ratio is achieved, as evidenced by a dip in the peak power envelope, the controller stops adjustment of that phase shifter and goes on to the next phase shifter in sequence. Each phase shifter is set in sequence, and then the controller repeats the cycle. In some applications it may be sufficient to just monitor the peak value of the power envelope.

Figure 6:
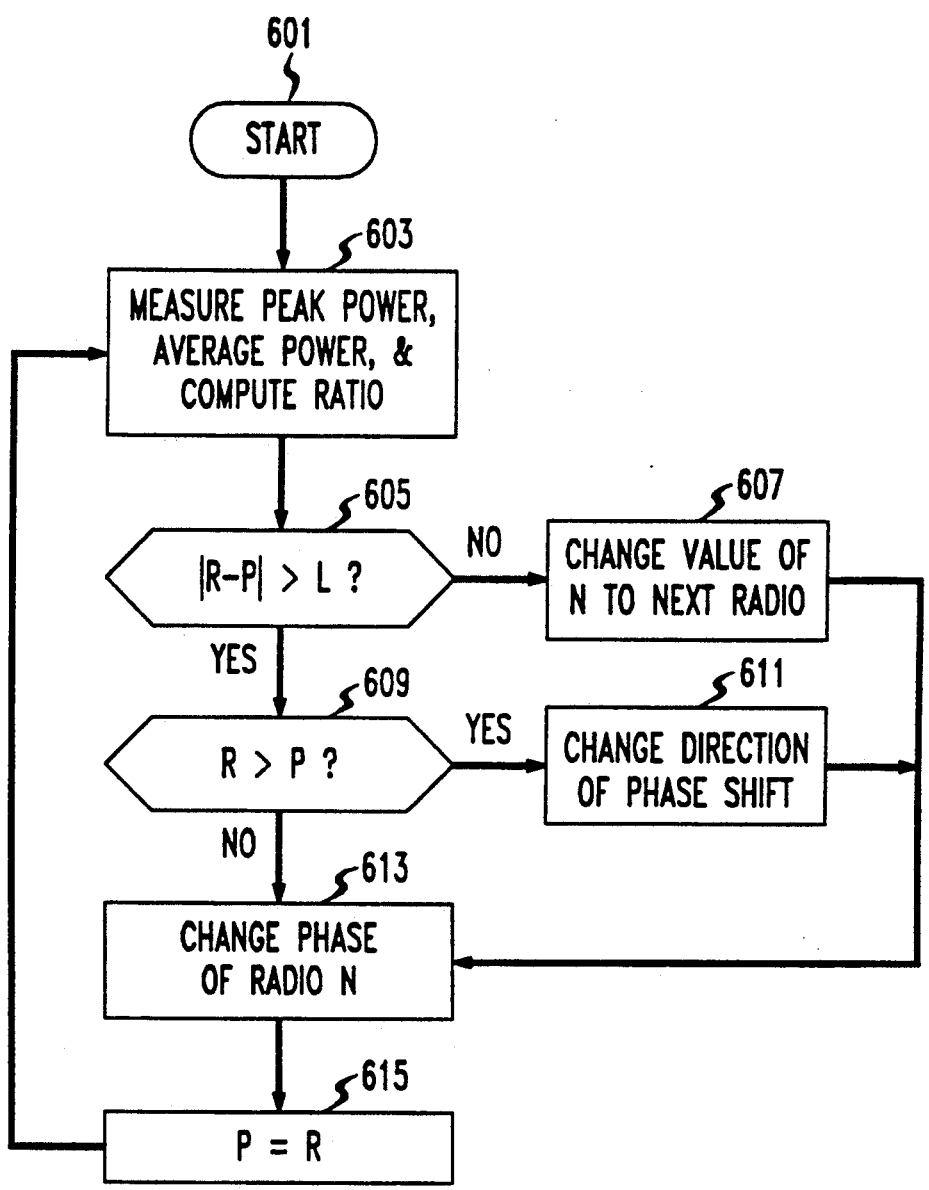
FIG. 6 is a flow process diagram of the method of reducing the peak to average power ratio.

The process of changing the phase of a radio, according to the instructions of the stored program of the controller, for a particular one of the radios N, is shown in flow chart form in the FIG. 6. The flow starts in the terminal 601 and the instructions of block 603 cause the peak envelope and average power to be measured and the peak envelope to average power ratio to be calculated. The instructions of decision block 605 determine if the absolute difference between the most recent peak-/average ratio measurement and the previous peak/average ratio measurement is greater than some minimum quantum phase value. This quantum value is an absolute value of phase change below which the phase of the current radio is considered to be optimum.

If the absolute difference in decision block 605 is greater than the minimum quantum phase value the flow proceeds to decision block 609 whose instructions determine if the most recent peak/average ratio is greater than the previous peak/average value. If it is not the phase of radio N is changed by some quantum value. The last computed peak/average ratio is made the most recent value in the block 615 and the flow process returns to the block 603.

If the response to the evaluation of decision block 605 is a no answer the flow proceeds to the block 607 which changes the N designation of the radio being adjusted to the next radio. The phase of this radio is changed as per the instructions of block 613.

In response to an affirmative response to decision block 609 the flow proceeds to block 611, whose instructions change the direction of the phase shift implemented. The radio phase is shifted in accord with the instructions of block 613.

The wave form, of FIG. 4 shows the occurrences of high peaks in the multicarrier signal envelope of the type that limit the peak power handling capacity of a linear amplifier system. The peaks 401 are significantly higher than the average power level 402.

Figure 5:
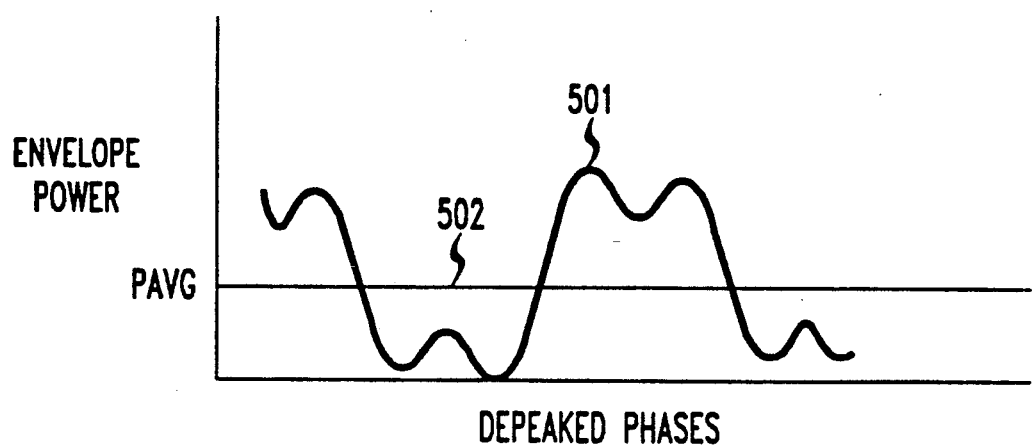

The improvement achieved by the method and apparatus to reduce these peaks is shown in the FIG. 5 where the peaks 501 relative to the average power level 502 are much reduced compared to the FIG. 4.

Figure 2:
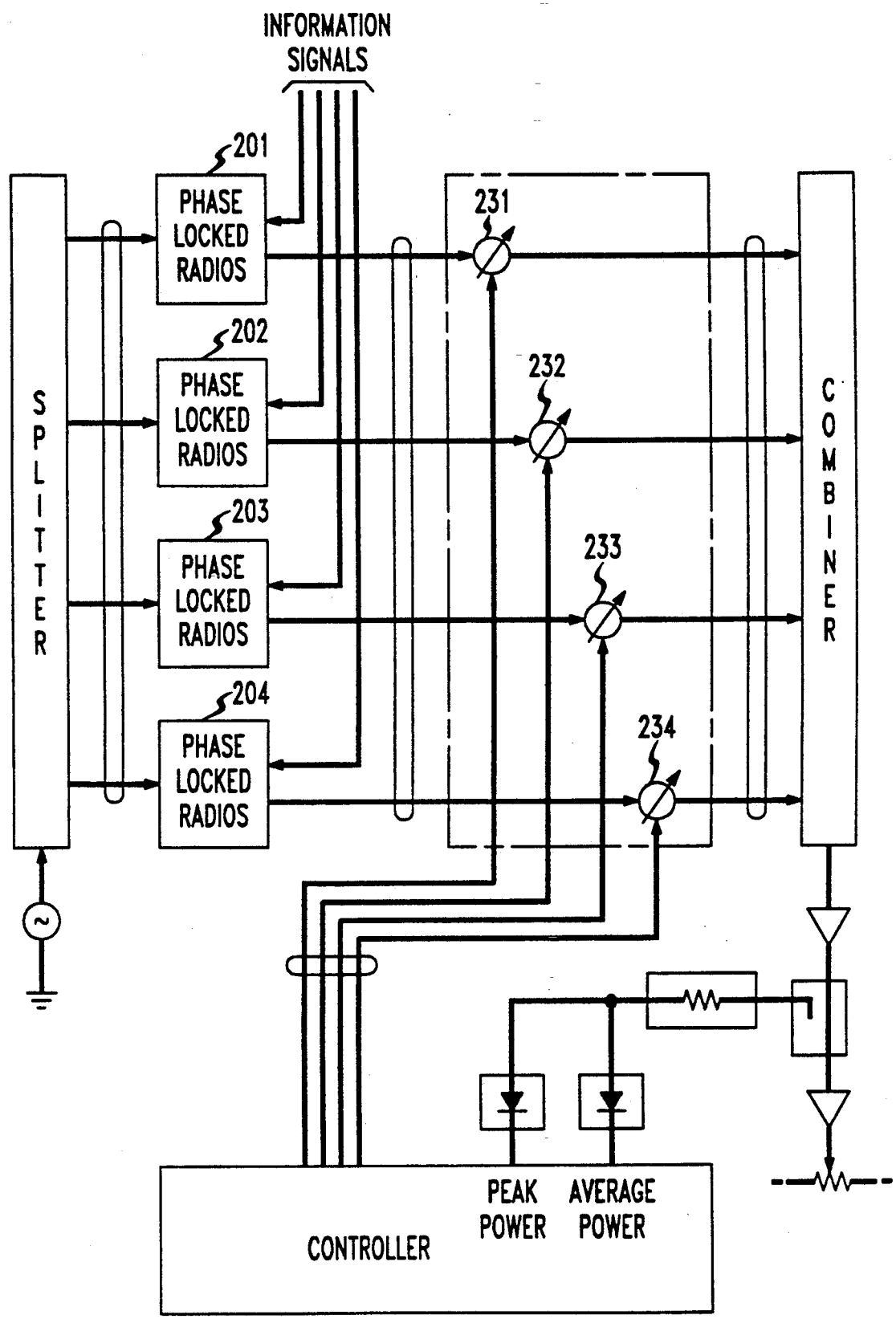
FIG. 2 is a block schematic of an another amplifier system control arrangement to limit the peak to average power ratio.

An alternative arrangement for preventing high to peak-to-average power ratios from occurring is shown in the FIG. 2. The system components are substantially identical to those described with reference to the FIG. 1 system, but their relative positioning is altered. The chief alteration is the positioning of the voltage controlled phase shifters 231-234 to phase shift the carrier at the outputs of the transceivers 201-204. This repositioning requires phase shifts in the order of 60 to 180 degrees to be effective. Otherwise the operation is substantially similar to the operation of the phase shift system of FIG. 1. The controller used here is identical to the controller of FIG. 3 except for the phase shift increment used.

We claim:

1. In a power amplifier system in which an individual amplifier processes a plurality of signal channel carriers each assigned different frequencies and spaced from one another by frequency differentials small in magnitude as compared with the assigned different frequencies, a method of increasing the average power handling capacity of the amplifier;
   comprising the steps of:
   monitoring a peak power level of the combined signals processed by the amplifier;
   determining if the peak power is equal to or greater than a power threshold;
   altering a phase of at least one of the carriers if the peak power is equal to or greater than the power threshold;
   again determining if the peak power is equal to or greater than the power threshold;
   altering a phase of additional carriers if the peak power is equal to or greater than the power threshold;
   ceasing alteration of phases of the carriers when the peak power drops below the threshold.

2. In a power amplifier in which an individual amplifier processes a plurality of signal channel carriers each equally spaced from one another by similar frequency differentials, a method of increasing the average power handling capacity of the amplifier;
   comprising the steps of:
   monitoring a peak power level of the combined signals processed by the amplifier;
   determining if the peak power is equal to or greater than a power threshold;
   altering a phase of at least one of the carriers if the peak power is equal to or greater than the power threshold;
   again determining if the peak power is equal to or greater than the power threshold;
   altering a phase of additional carriers if the peak power is equal to or greater than the power threshold;
   ceasing alteration of phases of the carriers when the peak power drops below the threshold.

3. In a power amplifier system in which an individual amplifier processes a plurality of signal channel carriers each assigned different frequencies and spaced from one another by frequency differentials small in magnitude as compared with the assigned different frequencies, a method of increasing the average power handling capacity of the amplifier;
   comprising the steps of:
   monitoring a peak power level and an average power level of the combined signals processed by the amplifier and determining a ratio of the peak power to the average power;
   altering a phase of at least one of the carriers and determining if the ratio of the peak power to the average power is reduced from an existing value;
   altering a phase of additional carriers and determining if the ratio of the peak power to the average power is reduced from an existing value;
   ceasing alteration of phases of the carriers when the ratio of the peak power to the average power is not further reduced.

4. A system for reducing the peak-to-average power ratio in an amplifier processing a plurality of different signal channels, each channel having a different carrier frequency, comprising:
   a plurality of radio transceivers connected to receive FM modulated information signals at different carrier frequencies for each of the radio transceivers;
   a plurality of phase shifters equal in number to and each connected to one of the plurality of radio transceivers;
   a combiner for combining all the modulated information signals into a composite modulated signal;
   an amplifier connected to amplify the composite modulated signal to a radio transmission level;

a coupling device for sensing power input to the amplifier;

a peak power detector and average power detector connected to the coupling device;

a controller connected to the peak power detector and to the average power detector for monitoring the peak to average power ratio and applying control signals to each of phase shifters for reducing the peak-to-average ratio by shifting a phase of a signal in individual channels.

5. A system for reducing the peak-to-average power ratio in an amplifier processing a plurality of different signal channels, each channel having a different carrier frequency, as claimed in claim 4, wherein:

each of the plurality of phase shifters are each connected to an input of one of the radio transceivers.

6. A system for reducing the peak-to-average power ratio in an amplifier processing a plurality of different signal channels, each channel having a different carrier frequency, as claimed in claim 4, wherein:

each of the plurality of phase shifters are each connected to an output of one of the radio transceivers.

* * * * *